(12) United States Patent
Hawkins et al.

(10) Patent No.: US 11,840,046 B2
(45) Date of Patent: Dec. 12, 2023

(54) ANISOTROPIC TEXTURED SURFACE

(71) Applicant: Lacks Enterprises, Inc., Grand Rapids, MI (US)

(72) Inventors: Thomas Hawkins, Spring Lake, MI (US); David Walters, Caledonia, MI (US); Alan Fanta, Grand Rapids, MI (US)

(73) Assignee: Lacks Enterprises, Inc., Grand Rapids, MI (US)

( * ) Notice: Subject to any disclaimer, the term of this patent is extended or adjusted under 35 U.S.C. 154(b) by 141 days.

(21) Appl. No.: 16/717,667

(22) Filed: Dec. 17, 2019

(65) Prior Publication Data

US 2020/0189235 A1 Jun. 18, 2020

Related U.S. Application Data

(60) Provisional application No. 62/781,335, filed on Dec. 18, 2018.

(51) Int. Cl.
*B60R 13/04* (2006.01)
*B44F 1/02* (2006.01)
(Continued)

(52) U.S. Cl.
CPC ............. *B32B 15/08* (2013.01); *B44F 1/02* (2013.01); *B60R 13/04* (2013.01); *C23C 14/35* (2013.01);
(Continued)

(58) Field of Classification Search
CPC ....... B29L 2031/722; B29L 2031/7224; G03H 2001/0055; B42D 25/328;
(Continued)

(56) References Cited

U.S. PATENT DOCUMENTS 4,094,575 A * 6/1978 Kellie ............... G03H 1/28
359/569
5,071,597 A * 12/1991 D'Amato ............ B29C 33/3857
264/225
(Continued)

FOREIGN PATENT DOCUMENTS

DE 102017004717 A1 * 11/2018
DE 102014210943 A9 * 10/2019
(Continued)

OTHER PUBLICATIONS

Machine translation of DE 102017/004717 A1.*
(Continued)

*Primary Examiner* — Z. Jim Yang
(74) *Attorney, Agent, or Firm* — Dickinson Wright PLLC

(57) ABSTRACT

A part includes a surface that having a rich textured appearance formed by an anisotropic repeating pattern including first regions having a first microtexture, and second regions having a second microtexture different from the first microtexture. A metalized layer covers the regions and presents different finishes depending on the microtexture thereunder. In an example embodiment, the first microtexture is highly reflective and the second microtexture is rough to cause a non-specular reflection of incident light. The part may include three-dimensional structures arranged to correspond with the repeating pattern. The three-dimensional structures may be spaced-apart by a base plane that may be flat or which may include some texture or structure. The three-dimensional structures may each include one or more planar portions and/or one or more curved surfaces. Each face or surface of the three-dimensional structures and/or each region of the base plane may have one or more different microtextures.

23 Claims, 5 Drawing Sheets

(51) Int. Cl.
  *B32B 15/08* (2006.01)
  *C23C 14/35* (2006.01)
  *C25D 7/00* (2006.01)

(52) U.S. Cl.
  CPC .......... *C25D 7/00* (2013.01); *B32B 2307/416* (2013.01); *B32B 2307/538* (2013.01); *B32B 2307/706* (2013.01); *B32B 2307/732* (2013.01); *B32B 2551/00* (2013.01)

(58) Field of Classification Search
  CPC ........ B44F 1/02–024; B44F 1/14; B44C 3/02; B44C 3/025; B44C 5/04; B44C 5/0415; G02B 5/18; G02B 5/1809; G02B 5/1814–1828; G02B 5/1842; G02B 5/1861; B60R 19/00; B60R 19/52; B60R 13/04; B60R 13/005
  See application file for complete search history.

(56) References Cited

U.S. PATENT DOCUMENTS

| | | | | |
|---|---|---|---|---|
| 6,602,578 B1* | 8/2003 | Tompkin | .................... | B44F 1/10 428/156 |
| 8,270,079 B1* | 9/2012 | Mossberg | ............ | G02B 5/1871 359/567 |
| 9,688,215 B1* | 6/2017 | Dellock | .................... | B44F 1/14 |
| 2003/0218786 A1* | 11/2003 | Yao | ...................... | G03H 1/0276 359/2 |
| 2005/0260386 A1* | 11/2005 | Heinrich | ........... | B29C 45/14811 428/141 |
| 2008/0206495 A1* | 8/2008 | Korechika | ............... | G02B 5/09 428/30 |
| 2008/0213541 A1* | 9/2008 | Schilling | .................. | B44C 1/00 264/293 |
| 2011/0281075 A1* | 11/2011 | Yamashita | .............. | B44F 1/045 428/164 |
| 2012/0164350 A1* | 6/2012 | Mayer Pujadas | ......... | B44F 1/02 205/184 |
| 2012/0236415 A1* | 9/2012 | Nagano | .................. | G02B 30/40 359/567 |
| 2013/0040090 A1* | 2/2013 | Sakurai | .................. | B29D 16/00 427/322 |
| 2013/0049557 A1 | 2/2013 | Ho et al. | | |
| 2013/0251945 A1* | 9/2013 | Bay | .......................... | B29C 39/14 264/495 |
| 2014/0087095 A1* | 3/2014 | Habert | ..................... | B60R 13/02 428/29 |
| 2015/0079289 A1* | 3/2015 | Sakurai | .................... | C23C 30/00 427/322 |
| 2015/0166844 A1* | 6/2015 | Clarke | ..................... | C09J 7/203 264/293 |
| 2015/0192897 A1* | 7/2015 | Schilling | .............. | B42D 25/346 359/2 |
| 2015/0268003 A1* | 9/2015 | Bazinski | ................... | F41H 3/00 428/187 |
| 2016/0178916 A1* | 6/2016 | Kakinuma | ........... | G02B 27/143 40/546 |
| 2016/0209557 A1* | 7/2016 | Cheatham, III | ......... | G02B 5/08 |
| 2016/0263698 A1* | 9/2016 | Noirot | .................. | B23K 26/359 |
| 2016/0265117 A1 | 9/2016 | Maloney et al. | | |
| 2016/0325824 A1* | 11/2016 | Rawlings | ................ | G09F 21/08 |
| 2017/0021660 A1* | 1/2017 | Petiton | ................. | B42D 25/324 |
| 2017/0106810 A1* | 4/2017 | Hattori | ................... | B60K 35/00 |
| 2017/0113628 A1* | 4/2017 | Sugiura | ................. | B32B 15/088 |
| 2018/0043724 A1* | 2/2018 | Hardwick | ............ | G02B 5/1842 |
| 2018/0106932 A1* | 4/2018 | Schill | .................... | G02B 5/0257 |
| 2018/0111570 A1* | 4/2018 | Dellock | ............... | G02B 27/4233 |
| 2018/0250854 A1* | 9/2018 | Dellock | ................ | C23C 18/1651 |
| 2018/0299584 A1* | 10/2018 | Zhang | .................. | B42D 25/351 |
| 2018/0334124 A1* | 11/2018 | Kinsler | ................... | B60R 13/00 |
| 2019/0217659 A1* | 7/2019 | Dellock | ................. | B60B 7/08 |
| 2020/0156360 A1* | 5/2020 | Mitsugi | ................. | B32B 37/025 |

FOREIGN PATENT DOCUMENTS

| | | | |
|---|---|---|---|
| JP | 2009045841 A | * | 3/2009 |
| JP | 2009045841 A | | 3/2009 |
| WO | 2020006015 A1 | | 2/2020 |

OTHER PUBLICATIONS

Machine translation of DE 102014/210943 A9.*
International Search Report in related PCT application PCT/US2019/067053, dated Apr. 21, 2020.

* cited by examiner

ANISOTROPIC TEXTURED SURFACE

CROSS-REFERENCE TO RELATED APPLICATIONS

This application claims the benefit of U.S. Provisional Application No. 62/781,335 filed Dec. 18, 2018 and entitled "Anisotropic Textured Surface". The entire disclosure of the above application is incorporated herein by reference.

BACKGROUND OF THE INVENTION

1. Field of the Invention

A molded and electroplated article with a surface having predetermined features to achieve two or more different finishes with a single metal layer is provided.

2. Discussion

Several different industries are increasingly interested in using molded parts having metalized finishes to enhance their appearance. The automotive industry is particularly interested in incorporating metalized parts into vehicles to yield different surface aesthetics. As technologies and consumer tastes have matured, the desire for more complicated parts and designs has evolved. As such, it has become more desirous to incorporate unique and visually appealing finishes into these components.

Consumers are attracted to vehicle components that give a distinctive appearance. Vehicle manufacturers are interested in providing improved aesthetics while still keeping costs under control. To that end, the industry commonly uses chrome plated finishes to achieve an experience that is pleasing to the consumer for both interior and exterior decoration. Also, as parts become more sophisticated due to technology advancements more features can be incorporated into parts. For example, some of the ways in which plated finishes can be differentiated from simple bright finishes include electroplated finishes with lower gloss levels, and electroplating plastic surfaces with sophisticated textures thereon to produce parts with a variety of different appearances. Plated parts may be further decorated with different colored translucent paint finishes. Furthermore, parts with surfaces that appear as complex and repeating geometric patterns have recently gained notice within the automotive industry.

Potential solutions have been explored for creating parts with such complex surface appearances using two or more separate plating finishes, which is expensive and cumbersome. However, these processes typically require multiple electroplating baths to produce the different finishes. These processes also typically require the parts to be specially formed, for example, using a multi-shot molding process. Forming and plating such parts using different circuits in different electroplating tanks is complicated by the additional step required and more expensive than plating a single finish.

SUMMARY OF THE DISCLOSURE

The present disclosure provides for a part with a surface that includes a plurality of regions arranged in a repeating pattern that is anisotropic. The repeating pattern can include a first region having a first microtexture, and a second region having a second microtexture different than the first microtexture. A reflective layer can cover each of the first region and the second region to present a finish that varies with the microtexture of the region thereunder.

According to an aspect, the reflective layer may comprise a thin layer of metal.

According to an aspect, the first microtexture may be a first surface roughness and the second microtexture may be a second surface roughness that differs from the first surface roughness. According to another aspect, the first region may be highly reflective and the second region may have a higher degree of roughness than the first microtexture on the first region such that it is less reflective. According to another aspect, the second microtexture on the second region may cause light incident thereupon to be non-specularly reflected. According to an aspect of the disclosure, the reflective layer may be disposed upon the surface by electroplating. Alternatively or additionally, the reflective layer may be disposed upon the surface by physical vapor deposition.

According to an aspect of the disclosure, the surface may include three-dimensional structures arranged to correspond with the repeating pattern. According to a further aspect, the three-dimensional structures may each include one or more of the microtextures having a common location and orientation on each respective one of the three-dimensional structures. According to a further aspect, the three-dimensional structures may each include a planar portion disposed at an oblique angle to the surface. Alternatively or additionally, the three-dimensional structures may each include a curved surface. According to a further aspect, the three-dimensional structures may define a recess, with the first region outside of the recess, and with the second region disposed within the recess.

The present disclosure also provides for a part with a surface presenting an anisotropic finish and which includes a first region having a first microtexture, and a second region having a second microtexture different than the first microtexture. A reflective layer comprising a thin layer of metal can cover each of the first region and the second region to present a finish that varies with the microtexture of the region thereunder.

A method of forming an anisotropic finish upon a part is also provided. The method may also include forming a repeating pattern upon a surface of the part, the repeating pattern including a first region having a first microtexture and a second region having a second microtexture different than the first microtexture. The method may also include covering each of the first region and the second region with a reflective layer. The reflective layer may present an anisotropic finish that varies with the microtexture of the region thereunder.

BRIEF DESCRIPTION OF THE DRAWINGS

Other aspects of the present disclosure will be readily appreciated, as the same becomes better understood by reference to the following detailed description when considered in connection with the accompanying drawings wherein.

DESCRIPTION OF ASPECTS OF THE DISCLOSURE

Referring to the Figures, wherein like numerals indicate corresponding components throughout the several views, a part 10 with a surface 20 that includes a rich textured appearance formed by a pattern of repeating surface elements or structures is illustratively shown.

Figure 1:
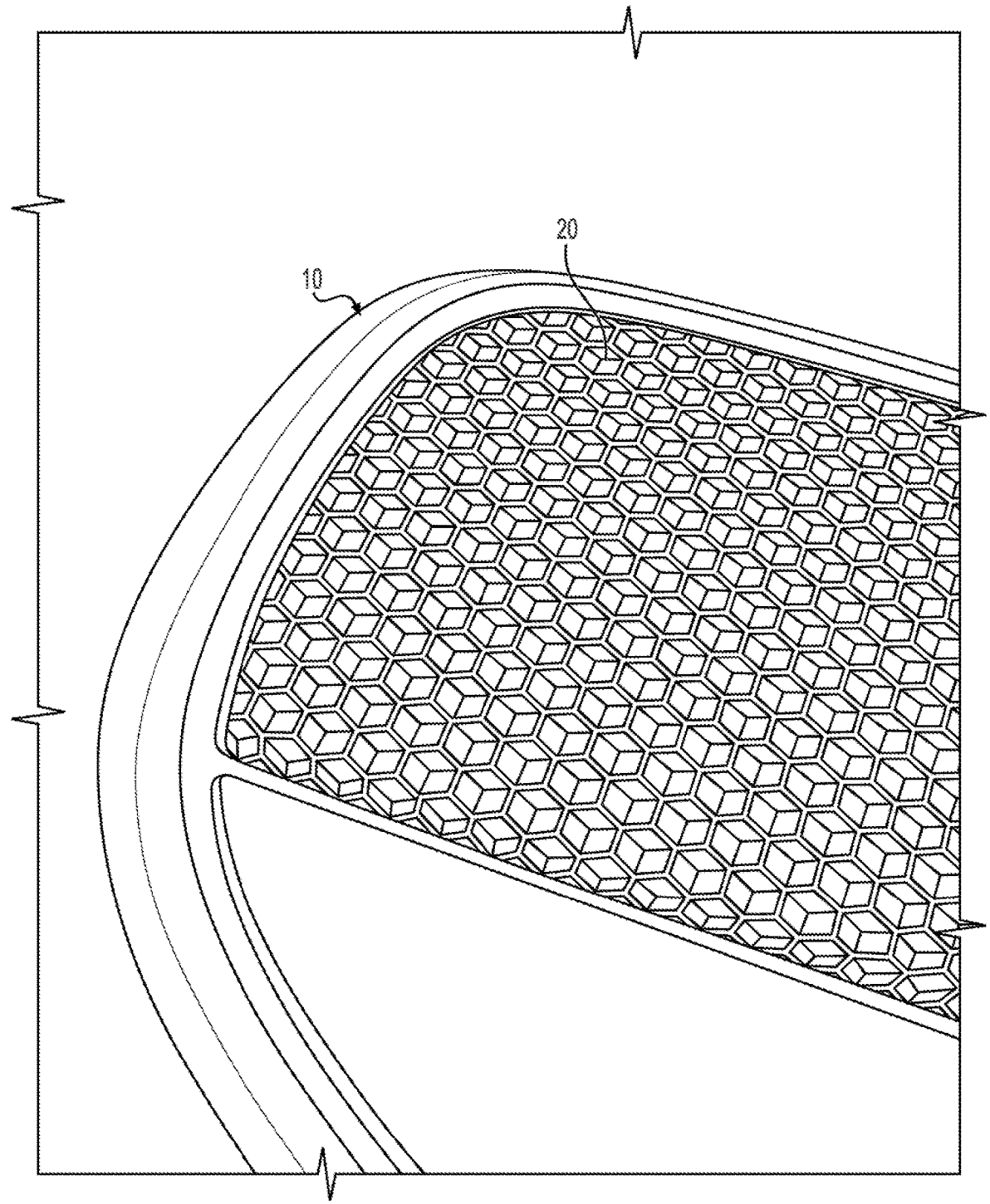
FIG. 1 is a perspective view of a part with multiple surface structures according to an aspect of the present disclosure.

The part 10, may be, for example, a molded article, such as a trim piece or a structural element for a vehicle. However, it will be appreciated that the inventive aspects herein may be applied to a variety of different automotive parts or different parts for different applications, i.e. furniture or appliances. FIG. 1 includes an example of one-such part 10 having a surface 20 that includes a repeating pattern of generally square-type structures formed thereon. The sharp corners and edges present in these surface structures create distinct facets or faces from which light can reflect in a variety of different directions. This in turn can create a sense of depth due to the way light is reflected off the various surfaces at different angles. The effect of the bright and shadowed areas can create an effect that is different from a planar reflective surface and one that adds value in the eye of the consumer and yields desired aesthetics. The part can be formed from a variety of different materials. One such material is an electroplatable resin. The part can also be formed from a variety of processes, such as injection molding.

Figure 2:
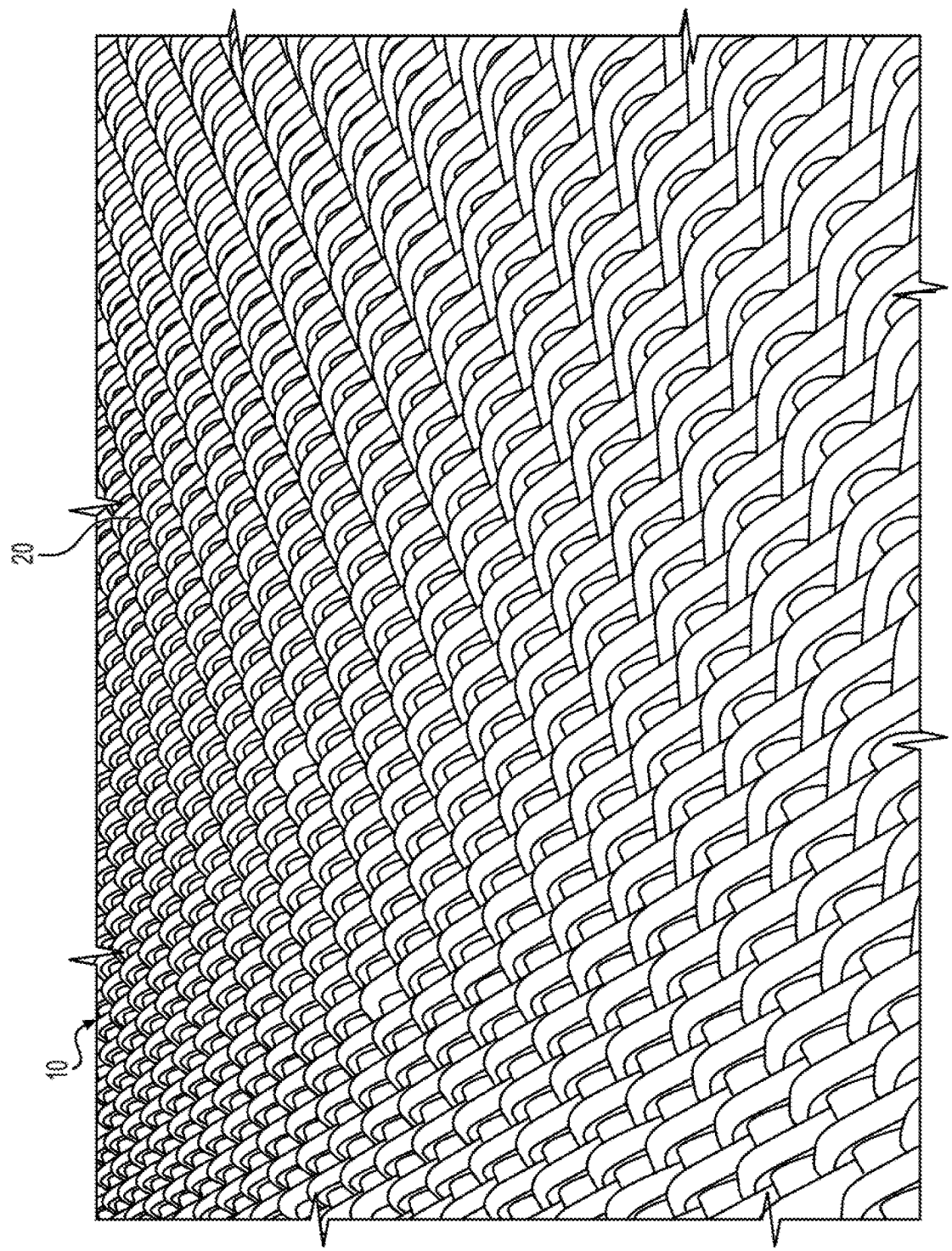
FIG. 2 is perspective view of a textured surface with structures arranged in a regular pattern according to another aspect of the present disclosure.

The potential designs for the surface structures that may be employed to create these effects are virtually unlimited. Surface structures are not limited to repeating units containing only facets or planes. Repeating units or structures may take a variety of forms. For example, a random array of surface structures not arrayed in a repeating pattern could also be employed on the surface. According to another aspect, and as illustrated in FIG. 2, a part 10 may include a surface 20 with a repeating pattern of structures consisting of spheres or other curved structures arranged in an array of rows along the surface. As shown in exemplary FIG. 2, the repeating pattern may provide the surface with a woven texture appearance.

Figure 3:
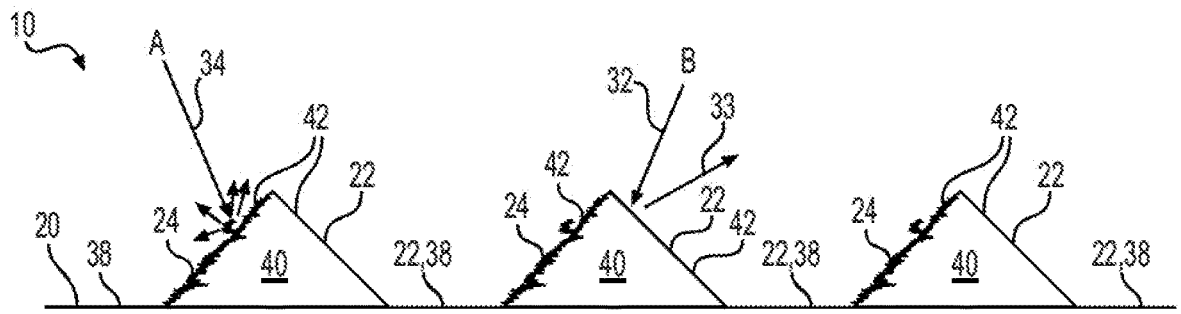
FIG. 3 is a schematic cross-sectional side view of a part having structures with different regions and microtextures that each react differently to incident light beams according to an aspect of the present disclosure.

According to an aspect of the disclosure shown in FIG. 3, the part 10 may include a surface 20 including a plurality of regions or structures arranged in a repeating pattern. As shown, according to this aspect, the structures may be a plurality of prism shaped elements formed in a repeating pattern across the surface. As shown, the structures may each include a first region 22 corresponding to one of its facets and having a first microtexture. The structures may include a second region 24 corresponding to another of its facets and having a second microtexture that is different from the first microtexture. Together, the plurality of surface structures may each include microtextures formed on its respective facets such that they are repeating, i.e., have the same location and orientation on each of the structures formed on the surface 20 of the part 10. The repeating pattern may be anisotropic. In other words, the repeating pattern of structures may appear differently depending on the direction from which it is viewed and/or depending on the direction of light incident thereupon.

According to a further aspect, a reflective layer 26 may cover each of the first region 22 and the second region 24. The reflective layer 26 may be a metalized layer including a thin layer of metal. Such a metalized layer may be disposed on the surface 20 by electroplating. The reflective layer 26 may be disposed on the surface by other means such as, for example, by physical vapor deposition (PVD), using a hot stamped reflective foil, or another means of depositing a thin layer of reflective material. It will be appreciated that other ways of creating a metal layer on a surface may be employed. The reflective layer can present a finish that varies with the microtexture of the region 22, 24 thereunder. In other words, the different microtextures of the different regions 22, 24 may cause those regions to appear differently from one another with the reflective layer covering them. The different regions 22, 24 may, for example, have different roughness levels and/or patterns formed in their surfaces causing them to appear differently from one another. The different regions 22, 24 may be formed using a 2-shot mold. Alternatively, the different regions 22, 24 may be formed at the same time from a single molding material and may be produced in a single-shot mold.

It should be appreciated that the surface 20 of the part 10 containing the microtextures may be, but is not necessarily, planar. For example, the surface 20 of the part 10 can have a 3-dimensional contour and still include the elements of the present disclosure.

According to another aspect of the disclosure as discussed herein, the first microtexture on the first region 22 may be a first roughness, and the second microtexture on the second region 24 may be a second roughness that is more or less rough than the first roughness. For example, as shown in FIG. 3, the first region 22 may have a first microtexture that is highly reflective and the second region 24 may have a higher degree of roughness than the first microtexture on the first region 22, resulting in the second region 24 being less reflective than the first region 22. Those different levels of roughness can cause different types of light reflection therefrom. For example, a first incident light beam 32 striking the first region 22 may have a specular, or mirror-like reflection to produce a reflected beam 33 having a minimal loss of intensity. A second light beam 34 that strikes the second region 24 may cause a non-specular reflection, such as a diffusion that gives the second region 24 an appearance of a dark or dull finish. It should be appreciated that the subject disclosure could be practiced using three or more different regions each having an associated different microtexture, which may be, three or more different levels of roughness, for example. A key factor is that the same metal material can be coated on the surface 20 of the part 10 and yield different appearances as a result of different underlying microtextures.

According to another aspect of the disclosure, the surface 20 of the part 10 can include three-dimensional structures 40 arranged to correspond with the repeating pattern. In other words, the three-dimensional structures 40 or portions thereof may be arranged in a repeating pattern that corresponds to the repeating pattern of the regions 22, 24. The three-dimensional structures 40 may be spaced-apart by a base plane 38 that may consist of flat regions of the surface 20. The base plane 38 may alternatively have some texture or structure, such as a regular or irregular pattern to further enhance the aesthetics of the part 10. The repeating pattern of the regions 22, 24 may include only the base plane 38, only the three-dimensional structures 40, and/or a combination of the base plane 38 and the three-dimensional structures 40. According to an aspect of the disclosure, the three-dimensional structures 40 may each include one or more of the microtextures. The microtextures on the three-dimensional structures may have common locations and orientations on each respective one of the three-dimensional structures 40. According to another aspect, the microtextures on the surface 20 between the three-dimensional structures 40 may also have common locations and orientations. One example of such a configuration is shown in FIG. 3.

According to another aspect of the disclosure, the three-dimensional structures 40 can each include one or more facets 42, 44, which may include a planar portion 42 disposed at an oblique angle to the surface 20. For example, the three-dimensional structures 40 may have a triangular cross-section, such as the example cross-sections shown in FIGS. 3 and 5. As shown in the example of FIG. 3, each of the three-dimensional structures 40 can include one or more planar portions 42 that define the first region 22 with the first, or polished, microtexture. In the example arrangement of FIG. 3, each of the three-dimensional structures 40 can include another planar portion 42 that defines the second region 24 with the second, or rougher, microtexture. The base plane 38 also defines a first region 22 with the first, or polished, microtexture in that example embodiment. However, the base plane 38 could, alternatively define a second region 24 with the second, or rougher, microtexture, such as the example embodiment shown in FIG. 4.

According to another aspect of the disclosure, the facets 42, 44 of the three-dimensional structures 40 may include one or more curved surfaces 44. An example of such curved surfaces are the three-dimensional structures 40 with semicircular cross-sections shown in FIGS. 3 and 6.

An example of a resulting anisotropic gloss effect is illustrated in FIG. 3. In condition A, light is scattered off a roughened surface producing reflected light that is scattered at different angles. In other words, the second light beam 34 striking the second region 24 results in a non-specular reflection which would cause the viewer to see a surface that is low gloss and a low distinctness of image. Conversely in condition B, light is specularly reflected off a smooth, mirror-like surface producing a high-gloss appearance with a high distinctness of image. The microtextures may occur in repeating patterns such that they have the same orientation where present on the surface 20 or on each facet 42, 44 of a repeating geometric unit, such as a geometric unit comprising one or more three-dimensional structures 40.

When the repeating three-dimensional structures 40 have a different surface roughness on one facet 42, 44 compared to the surface roughness on other facets 42, 44, the viewer will see a different looking part in one direction when compared to others. When the viewer sees the facets 42, 44 that are roughened, the part 10 will appear less glossy when viewed from other angles where the smooth mirror like surfaces face the viewer. Thus, the part 10 will exhibit anisotropic gloss that is dependent on the angle and direction from which it is viewed despite a single metal layer being disposed on the entire surface. The effect can be enhanced by intentionally creating a mold with roughened facets on more than one repeating facet 42, 44. In fact, all of the microtextured facets 42, 44 could be roughened leaving only the base plane 38 as a bright, reflective surface. Alternatively, the base plane 38 may define the second region 24 with a roughened surface, and the three-dimensional structures 40 may define the highly reflective first regions 22 as shown in the example embodiment of FIG. 4.

According to another aspect of the disclosure, the difference in microtextures, such as roughness or gloss level, may be applied to either the base plane 38 or a simple geometric shape. In FIG. 2, for example, the straight cylindrical rods could have one gloss level while the curved wire mesh could have a second roughness, or gloss level.

Figure 4:
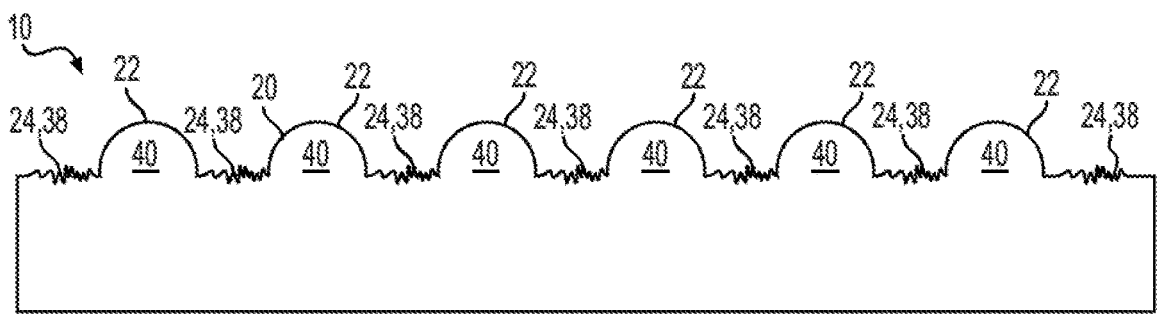
FIG. 4 is a schematic cross-sectional side view of a part having different regions and microtextures on different physical structures according to an aspect of the present disclosure.
Figure 5:
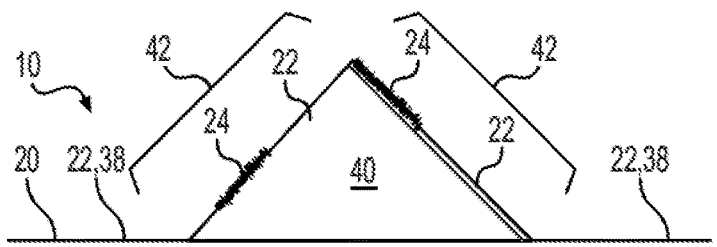
FIG. 5 is a schematic cross-sectional side view of a part having different microtextures on different regions of a single face of a structure according to another aspect of the present disclosure.
Figure 6:
FIG. 6 is a schematic cross-sectional side view of a part having different microtextures on different regions of a non-planar surface structures according to a further aspect of the present disclosure.

According to another aspect of the disclosure, and as shown in the examples of FIGS. 3, and 4, each facet 42, 44 of the three-dimensional structures 40 and/or each region of the base plane 38 may have a uniform microtexture. Alternatively, and as illustrated in the example embodiment on FIG. 5, one or more of the facets 42, 44, such as the planar portions 42 may include two or more different microtextures. As shown in FIGS. 5 and 6, portions of a three-dimensional structure 40 may have a roughened surface. This roughening may be done in a repeated manner on a portion of an individual facet 42, 44 randomly, or in a predetermined pattern.

Figure 7:
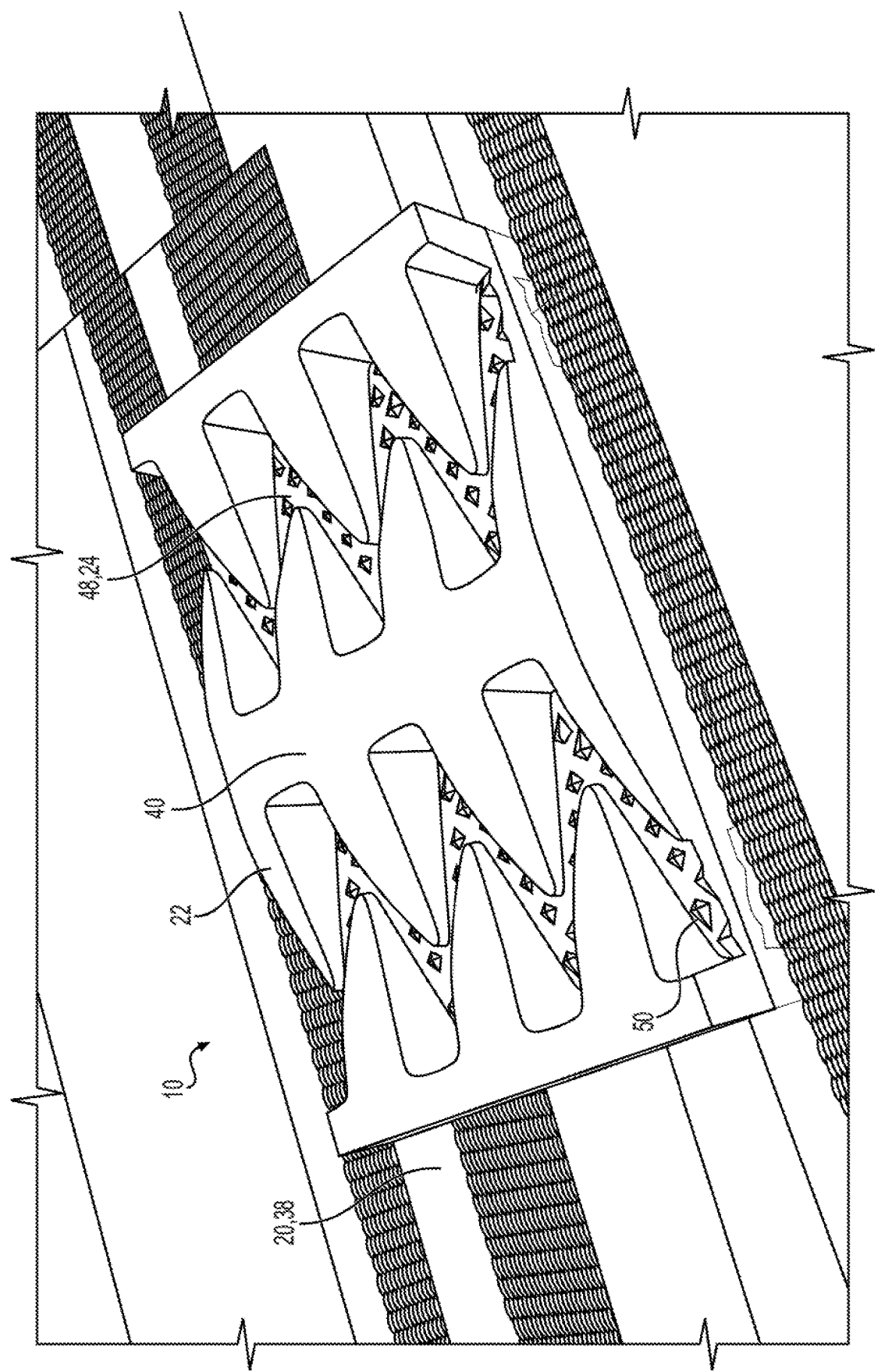
FIG. 7 is a perspective view of a part including a plurality of microstructures within a recess formed in a part surface according to still another aspect of the present disclosure.

According to another aspect of the disclosure as exemplarily shown in FIG. 7, the three-dimensional structures 40 may each define one or more recesses 48, with the first region 22 outside of the recess 48, and with the second region 24 disposed within the recess 48. The recesses 48 may extend to, above, or below the base plane 38. Furthermore, sub-structures 50 may be present within the recesses 48. All or parts of the larger structures could contain gloss levels different than the base plane 38 and/or the three-dimensional structures 40.

According to another aspect of the disclosure, one or more of the base plane 38, the three-dimensional structures 40 and/or the sub-structures 50 could include a clear, colored, or translucent organic coating. According to a further aspect, a translucent top coat may be disposed over the reflective layer to provide protection to the underlying layer.

Figure 8:
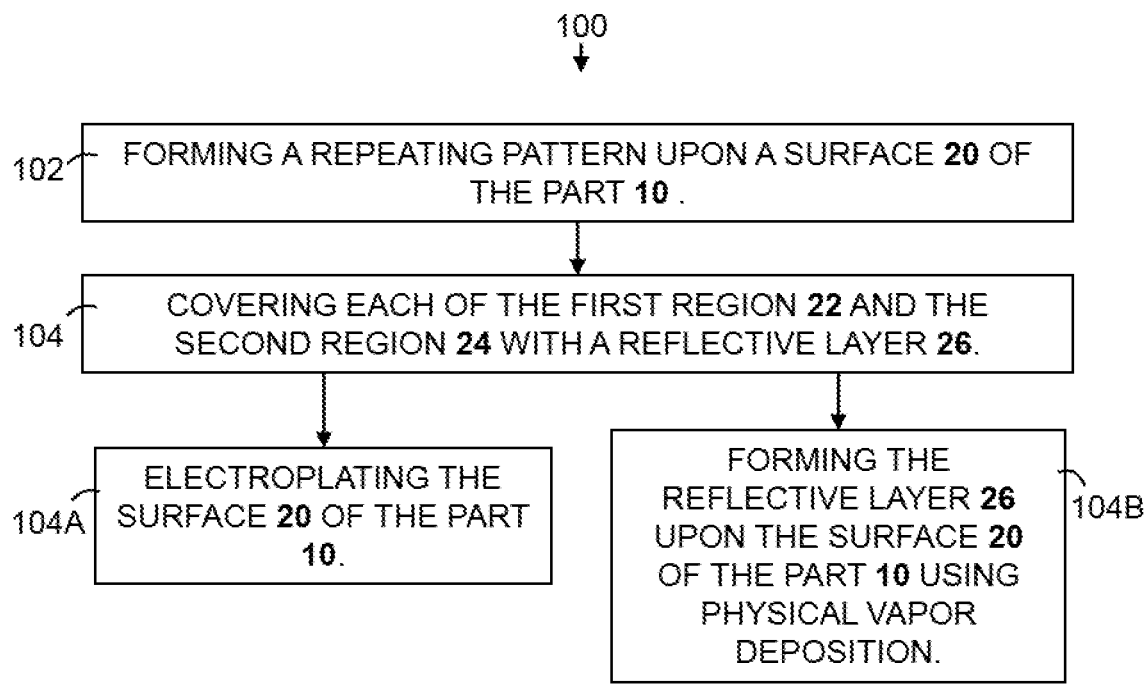
FIG. 8 is a flow chart listing steps in a method of forming an anisotropic finish upon a part.

As described in the flow chart of FIG. 8, a method 100 of forming an anisotropic finish upon part 10 is also provided. The method 100 may include forming a repeating pattern upon a surface 20 of the part 10 at step 102. The repeating pattern may include a first region 22 having a first microtexture and a second region 24 having a second microtexture different than the first microtexture. The method 100 may also include covering each of the first region 22 and the second region 24 with a reflective layer 26 at step 104. The reflective layer 26 may present an anisotropic finish that varies with the microtexture of the region thereunder.

According to an aspect, step 104 of covering each of the first region 22 and the second region 24 with a reflective layer 26 may include electroplating the surface 20 of the part 10 at sub-step 104A.

According to an aspect, step 104 of covering each of the first region 22 and the second region 24 with a reflective layer 26 may include forming the reflective layer 26 upon the surface 20 of the part 10 using physical vapor deposition at sub-step 104B.

The foregoing description of the embodiments has been provided for purposes of illustration and description. It is not intended to be exhaustive or to limit the disclosure. Individual elements, assemblies/subassemblies, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An automotive structural component comprising:
   an injection molded plastic substrate of metal-plateable resin;
   a surface of the molded plastic substrate including a plurality of three-dimensional structures projecting from a base of the surface and disposed across the surface in a plurality of locations, the surface of the molded plastic substrate including a first region having a first microtexture and a second region having a second microtexture different than the first microtexture;
   a reflective layer completely covering the base of the surface and the three-dimensional structures of the surface and each of the first region and the second region of the surface;
   wherein the reflective layer defines a finish that varies along with and corresponds to the microtexture of the first region and the second region over which the reflective layer is applied; and
   wherein the reflective layer applied over the surface appears differently depending on at least one of: a direction from which the surface is viewed, or a direction of light incident upon the surface;
   wherein the second microtexture on the second region causes light incident thereupon to be non-specularly reflected and the first microtexture of the first region causes light incident thereupon to be specularly reflected;
   wherein the respective first and second microtextures of a given first and second region are directly adjacent to each other along a direction parallel to the base of the surface.

2. The automotive structural component of claim 1, wherein the reflective layer comprises a thin layer of metal.

3. The automotive structural component of claim 1, wherein the first microtexture is a first roughness and wherein the second microtexture is a second roughness that is different from the first roughness.

4. The automotive structural component of claim 3, wherein the first region is highly reflective and wherein the second region has a higher degree of roughness than the first microtexture on the first region.

5. The automotive structural component of claim 1, wherein the reflective layer is disposed upon the surface by electroplating.

6. The automotive structural component of claim 1, wherein the reflective layer is disposed upon the surface by physical vapor deposition.

7. The automotive structural component of claim 1, wherein the three-dimensional structures are arranged in a repeating pattern.

8. The automotive structural component of claim 7, wherein
   one or more of the microtextures on the three-dimensional structures have a common location and orientation on each respective one of the three-dimensional structures.

9. The automotive structural component of claim 7, wherein the three-dimensional structures are prism-shaped and each include a planar portion disposed at an oblique angle to the surface.

10. The automotive structural component of claim 7, wherein the three-dimensional structures each include a curved surface.

11. The automotive structural component of claim 7, wherein select ones of the three-dimensional structures define a recess therebetween, and wherein the three-dimensional structures include the first region outside of the recess, and wherein the second region is disposed within the recess.

12. The automotive component of claim 1, wherein each of the three-dimensional structures include first and second surfaces on opposite sides of an apex and facing opposite directions relative to a plane extending normal to the surface of the base substrate, wherein the first surfaces of each of the three-dimensional structures face the same direction and the second surfaces of each of the three-dimensional structures face the same direction, wherein the first microtexture is disposed on each of the first surfaces and the second microtexture is disposed on each of the second surfaces, such that each of the first microtextures face the same direction and each of the second microtextures face the same direction, wherein the first microtexture defines a first roughness and the second microtexture defines a second roughness different than the first roughness.

13. The automotive component of claim 12, wherein the automotive component appears differently when viewed from one side of the plane relative to being viewed from an opposite side of the plane, wherein the first microtextures on each of the three-dimensional structures are viewable from the one side of the plane, and the second microtextures on each of the three-dimensional structures are viewable from the opposite side of the plane.

14. The automotive component of claim 1, wherein the base of the surface is curved or planar.

15. The automotive component of claim 1, wherein each of the three-dimensional structures has respective ones of the first microtexture and the second microtexture.

16. The automotive component of claim 1, wherein one of the three-dimensional structures has the first microtexture at a first height relative to the base surface and another of the three-dimensional structure has the second microtexture at the first height relative to the base of the surface.

17. An automotive structural component comprising:
   a molded plastic substrate of metal-plateable resin;
   a surface of the molded plastic substrate including a plurality of three-dimensional structures defining an anisotropic appearance, the plurality of three-dimensional structures projecting from a base portion of the surface, the surface including a first microtexture and a second microtexture different than the first microtexture, wherein the first microtexture and the second microtexture are disposed on at least one of the base portion or the three-dimensional structures;
   a reflective layer comprising a thin layer of metal continuously covering the surface including the base portion and the three-dimensional structures projecting therefrom and including each of the first microtexture and the second microtexture disposed thereon; and
   wherein the reflective layer defines a finish that varies with and corresponds to the first and second microtexture over which the reflective layer is applied;

wherein the second microtexture causes light incident thereupon to be non-specularly reflected and the first microtexture causes light incident thereupon to be specularly reflected:
wherein the respective first and second microtextures of a given region of the base surface or the three-dimensional structure are disposed at the same elevation range relative to the base portion.

18. The automotive structural component of claim 17, wherein the first microtexture is a first roughness and wherein the second microtexture is a second roughness that is different from the first roughness; and
wherein the reflective layer over the first microtexture is highly reflective and wherein the reflective layer over the second microtexture has a higher degree of roughness than the reflective layer over the first microtexture.

19. The automotive structural component of claim 17, wherein the three-dimensional structures are arranged in a repeating pattern.

20. The automotive structural component of claim 17, wherein the reflective layer is disposed upon the surface by one of electroplating or physical vapor deposition.

21. The automotive component of claim 17, wherein the first and second microtextures are disposed laterally adjacent each other in a direction parallel to the base portion.

22. The automotive component of claim 17, wherein a first portion of the three-dimensional structure includes the first microtexture at a first elevation range relative to the base portion and a second microtexture at a second elevation range relative to the base portion, and a second portion of the three-dimensional structure includes the second microtexture at the first elevation range and the first microtexture at the second elevation range.

23. An automotive structural component comprising:
an injection molded plastic substrate of metal-plateable resin;
a surface of the molded plastic substrate including a plurality of three-dimensional structures projecting from a base of the surface and disposed across the surface in a plurality of rows, the plurality of three-dimensional structures including a first region having a first microtexture and a second region having a second microtexture different than the first microtexture;
a reflective layer completely covering the base of the surface and the three-dimensional structures and each of the first region and the second region thereof;
wherein the reflective layer defines a finish that varies along with and corresponds to the microtexture of the first region and the second region over which the reflective layer is applied;
wherein the reflective layer applied over the surface appears differently depending on at least one of: a direction from which the three-dimensional structures are viewed, or a direction of light incident upon the three-dimensional structures;
wherein each of the three-dimensional structures include first and second surfaces on opposite sides of an apex and facing opposite directions relative to a plane extending normal to the surface of the base substrate, wherein the first surfaces of each of the three-dimensional structures face the same direction and the second surfaces of each of the three-dimensional structures face the same direction, wherein the first microtexture is disposed on each of the first surfaces and the second microtexture is disposed on each of the second surfaces, such that each of the first microtextures face the same direction and each of the second microtextures face the same direction, wherein the first microtexture defines a first roughness and the second microtexture defines a second roughness different than the first roughness
wherein the automotive component appears differently when viewed from one side of the plane relative to being viewed from an opposite side of the plane, wherein the first microtextures on each of the three-dimensional structures are viewable from the one side of the plane, and the second microtextures on each of the three-dimensional structures are viewable from the opposite side of the plane
wherein the first microtextures provide a specular reflection and the second microtextures provide a non-specular reflection.

* * * * *